United States Patent
Takagi

(10) Patent No.: US 7,080,302 B2
(45) Date of Patent: Jul. 18, 2006

(54) SEMICONDUCTOR DEVICE AND TEST SYSTEM THEREFOR

(75) Inventor: Ryoichi Takagi, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 385 days.

(21) Appl. No.: 10/163,579

(22) Filed: Jun. 7, 2002

(65) Prior Publication Data
US 2003/0011396 A1    Jan. 16, 2003

(30) Foreign Application Priority Data
Jul. 12, 2001  (JP) ............................ 2001-212491

(51) Int. Cl.
*G01R 31/28*  (2006.01)
(52) U.S. Cl. .................. 714/734; 714/718; 714/724
(58) Field of Classification Search ............ 714/726, 714/727, 728, 731, 735, 736, 738, 739, 744, 714/734, 718, 724, 729
See application file for complete search history.

(56) References Cited

U.S. PATENT DOCUMENTS

| 5,305,331 | A | * | 4/1994 | Sato et al. ................... 714/715 |
| 5,400,342 | A | * | 3/1995 | Matsumura et al. ......... 714/719 |
| 5,619,512 | A | * | 4/1997 | Kawashima et al. ........ 714/733 |
| 5,621,739 | A |   | 4/1997 | Sine et al. ................... 714/724 |
| 5,812,562 | A | * | 9/1998 | Baeg .......................... 714/726 |
| 6,275,023 | B1 | * | 8/2001 | Oosaki et al. ........... 324/158.1 |
| 6,347,387 | B1 | * | 2/2002 | Fischer ...................... 714/738 |
| 6,466,496 | B1 | * | 10/2002 | Kuge ........................ 365/201 |
| 6,690,154 | B1 | * | 2/2004 | Jones et al. ............. 324/158.1 |
| 6,694,461 | B1 | * | 2/2004 | Treuer ........................ 714/719 |
| 6,704,897 | B1 | * | 3/2004 | Takagi ........................ 714/739 |
| 6,708,301 | B1 | * | 3/2004 | Ohta et al. .................. 714/724 |

FOREIGN PATENT DOCUMENTS

JP            3117214            5/1991

* cited by examiner

*Primary Examiner*—Albert Decady
*Assistant Examiner*—Fritz Alphonse
(74) *Attorney, Agent, or Firm*—Buchanan Ingersoll PC

(57) ABSTRACT

The present invention provides a test system for a semiconductor device, the test system comprising: a test data generator for generating test data, the test data generator being provided in an output section; a delay circuit for, in order to use as expected-value data the test data after the test data is transferred through inside a chip, adjusting a time difference between the test data and the expected-value data; a comparator for, against the expected-value data, comparing and verifying the test data after the test data is transferred outside the chip, the comparator being provided in an input section; and an external wiring for connecting an output pin connected to the test data generator and an input pin connected to the comparator.

17 Claims, 6 Drawing Sheets

SEMICONDUCTOR DEVICE AND TEST SYSTEM THEREFOR

BACKGROUND OF THE INVENTION

1. Field of the Invention

The present invention relates to a semiconductor device and a test system therefor, and particularly to a test circuit for the input/output (I/O) interface of a semiconductor device.

2. Description of the Prior Art

A semiconductor test device (hereinafter referred to as an LSI tester) is used to verify the operation of a semiconductor device (LSI). To perform the test at the same speed as the system operation speed, the LSI tester must have an operation speed as high as that of the I/O interface of the LSI.

Brief description will be made below of a conventional LSI test. FIG. 6 is a block diagram showing a conventional test system for a semiconductor device. In the figure, reference numeral 1001 denotes an LSI tester; 1002 denotes a DUT board; 1003 denotes an LSI; 1004 denotes a pin card; and 1005 denotes circuit elements such as comparators and drivers. By use of computer control, the LSI tester 1001 creates an environment similar to the actual operation environment in which the LSI 1003 is operated, and determines whether or not the LSI 1003 is defective. The LSI tester 1001 includes a timing generator, a test-pattern generator, a formatter, and a power source, and applies an input signal to the LSI 1003 and compares the output response with its prepared expected value. The pin card 1004 is the final output stage producing a predetermined waveform, and includes circuit elements such as comparators to compare data output from the LSI 1003 with its expected value.

To perform a functional test on the LSI 1003, test vectors generated by the LSI tester are applied to the LSI 1003, and the output responses are compared with their expected values in order to verify the operation of the core logic including that of the input/output section.

Having a circuit configuration as described above, the conventional test system for semiconductor devices is not economical when applied to mass production of, particularly, multipin LSIs having a Gbps-class I/O since the high-speed LSI tester for those LSIs is expensive.

The high speed operation of the 1-Gbps-class LSI and an I/O timing (Setup, Hold, CLK_to_Q) of several tens to several hundreds of ps are already an operation limit and a timing limit of the conventional test system for semiconductor devices, making it difficult to perform a highly reliable test.

One method for solving the above problem is to externally connect between the output terminals and the input terminals of an LSI (or LSIs) so as to perform an operation test on the I/O interface at the actual operation speed (using a loop or connecting one chip with another). In this connection, Japanese Patent Application No. 2000-95552 (application number) discloses a semiconductor device having a test pattern generator and a data compressor therein.

On the other hand, JP-A No. 3-117214 (1991) discloses an example in which the input pins and the output pins of a single LSI or a plurality of LSIs are connected in a loop, and an actual communication operation test is performed on the I/O interface of the LSI (or LSIs). However, the output section of the above system does not include a test data generator for testing the LSI at the actual operation speed. Furthermore, its input section does not include: a comparator for sequentially comparing external data with its expected-value data supplied from the test data generator; a delay circuit for adjusting the comparison timing; and a strobe function.

SUMMARY OF THE INVENTION

In order to solve the above problems, it is an object of the present invention to provide a semiconductor device and a test system therefor capable of performing an actual operation test on the high-speed I/O interface of a semiconductor device.

A semiconductor device according to the present invention comprises: test data generating means for generating test data; data adjusting means for, in order to use as expected-value data the test data to be transferred inside a chip, adjusting a time difference between the test data and the expected-value data; and comparison means for comparing and verifying the test data to be transferred outside the chip to the expected-value data, the comparison means being provided in an input section.

In the semiconductor device according to the present invention, the test data generating means is provided in an output section to output the test data and simultaneously transfer the test data through the data adjusting means to produce the expected-value data and transmit the produced expected-value data to the comparison means.

In the semiconductor device according to the present invention, the test data generating means includes: a first test data generating means for generating test data to be transferred outside the chip, the first test generating means being provided in an output section; and a second test data generating means for generating test data to be transferred through the data adjusting means and set as expected-value data, the second test data generating means being provided in an input section.

In the semiconductor device according to the present invention, the test data generating means includes an LFSR which operates at an actual operation speed.

In the semiconductor device according to the present invention, the comparison means includes a comparator which, at an actual operation speed, compares and verifies test data received from the outside and expected-value data transferred through inside the chip.

In the semiconductor device according to the present invention, the data adjusting means includes a delay circuit which delays test data transferred through inside the chip to produce expected-value data.

In a test system for a semiconductor device according to the present invention, the semiconductor device includes: test data generating means for generating test data; data adjusting means for, in order to use as expected-value data the test data to be transferred inside a chip, adjusting a time difference between the test data and the expected-value data; and comparison means for comparing and verifying the test data to be transferred outside the chip to the expected-value data, the comparison means being provided in an input section; and the test system comprising: an external wiring for connecting an output of the test data generating means and an input of the comparison means.

In the test system for the semiconductor device according to the present invention, the test data generating means is provided in an output section to output the test data and simultaneously transfer the test data through the data adjusting means to produce the expected-value data and transmit the produced expected-value data to the comparison means.

In the test system for the semiconductor device according to the present invention, the test data generating means includes: a first test data generating means for generating test data to be transferred outside a chip, the first test data generating means being provided in an output section; and a second test data generating means for generating test data to be transferred through the data adjusting means and set as expected-value data, the second test data generating means being provided in an input section.

In the test system for the semiconductor device according to the present invention, the semiconductor device is made up of a plurality of semiconductor devices, and an input pin and an output pin of each of the plurality of semiconductor devices are connected by use of an external wiring.

In the test system for the semiconductor device according to the present invention, the test data generating means includes an LFSR which operates at an actual operation speed.

In the test system for the semiconductor device according to the present invention, the comparison means includes a comparator which, at an actual operation speed, compares and verifies test data received from outside and expected-value data transferred through inside the chip.

In the test system for the semiconductor device according to the present invention, the data adjusting means includes a delay circuit which delays test data transferred through inside the chip to produce expected-value data.

A semiconductor device according to the present invention comprises: a circuit to be tested which receives external data from a data input pin; data latch means for, from a strobe pin, applying a strobe signal set according to a predetermined specification, and capturing output data from the circuit to be tested and a clock input from an external clock pin; and register means for extracting data latched in the data latch means; wherein a wiring segment from the data input pin to the data latch means, another wiring segment from the circuit to be tested to the data latch means, and still another wiring segment from the external clock pin to the circuit to be tested all have a same length.

In the semiconductor device according to the present invention, the data latch means includes a plurality of flip-flops for strobing operation, and wiring segments from the strobe pin to the plurality of flip-flops for strobing operation all have a same length.

In the semiconductor device according to the present invention, the circuit to be tested is made up of an internal flip-flop; and a wiring segment from an output of the circuit to be tested to an input of a respective one of the plurality of flip-flops for strobing operation, another wiring segment from a data input of the internal flip-flop to a data input of a respective one of the plurality of flip-flops for strobing operation, and still another wiring segment from the external clock pin to the internal flip-flop all have a same length.

In the semiconductor device according to the present invention, a shift register for scanning is connected to outputs of the plurality of flip-flops for strobing operation, and the outputs are lead out of a chip by use of JTAG pins.

DETAILED DESCRIPTION OF THE PREFERRED EMBODIMENTS

An embodiment of the present invention will be described below.

Embodiment 1

Figure 1:
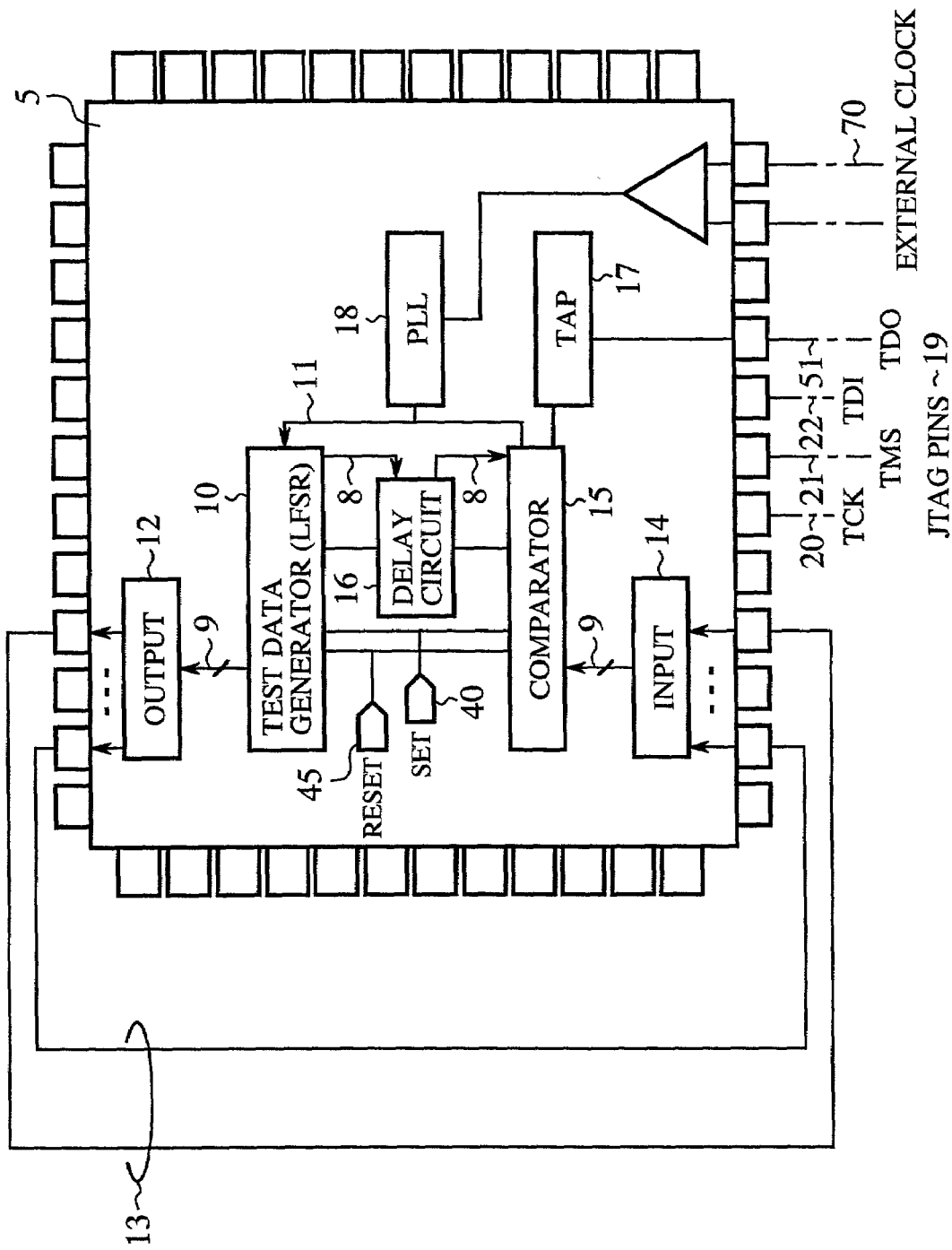
FIG. 1 is a block diagram showing a test system for a semiconductor device according to a first embodiment of the present invention.

FIG. 1 is a block diagram showing a test system for a semiconductor device according to a first embodiment of the present invention. In the figure, reference numeral 5 denotes an LSI (semiconductor device); 8 denotes expected-value data used as comparison data; 9 denotes test data of pseudorandom data; 10 denotes a test data generator (test data generating means in the output section); 11 denotes a clock; 12 denotes an output buffer; 13 denotes an external wiring; 14 denotes an input buffer (input section); 15 denotes a comparator (comparison means); 16 denotes a delay circuit (data adjusting means); 17 denotes a test access port (TAP); 18 denotes a PLL; 19 denotes JTAG pins; 20 denotes a TCK pin for test clock input (TCK); 21 denotes a TMS pin for test mode selection input (TMS); 22 denotes a TDI pin for serial data input (TDI); 51 denotes a TDO pin for serial data output (TDO); 70 denotes an external clock; 40 denotes a SET pin; and 45 denotes a RESET pin.

It should be noted that the test data generator 10 is an LFSR made up of a plurality of flip-flops (F/Fs). It is possible to generate pseudorandom data as test data by applying to the LFSR the clock 11, which is obtained as a result of passing the external clock 70 through the PLL 18. Furthermore, if the clock 11 can be supplied at a speed as high as the system operation speed, the pseudorandom data can be supplied as the test data 9 at the actual operation speed. The test data 9 is transferred to the output buffer 12 which in turn outputs the data at the actual operation speed. The test data 9 output from the output buffer 12 is transferred to the input buffer 14 through the external wiring 13, which connects the output buffer 12 and the input buffer 14.

The test data 9 which has reached the input buffer 14 is taken into the F/Fs included in the buffer. The test data 9 is compared with its expected-value data 8 (which is the same as the test data 9 at the time when it was output from the LFSR included in the test data generator 10) by the comparator 15 at the last stage of the F/Fs and verified in the LSI 15. At that time, there exists a time difference between the test data 9 transferred from the outside and the comparison data (that is, the expected-value data 8) transferred inside the LSI 5. To remove (adjust) this time difference, the delay circuit 16 delays the timing of the expected-value data 8.

It should be noted that the JTAG control is used to control the following operations: the activation of the LFSR incorporated in the test data generator 10; the activation of the comparator 15; setting of the delay amount of the delay circuit 16; application of set and reset signals to the SET pin 40 and the RESET pin 45 for the test data 9; and application of the clock 11 from the PLL 18. The JTAG control is performed by use of signal pins such as the TCK 20, the TMS pin 21, and the TDI pin 22 constituting the JTAG pins 19. JTAG was standardized in 1990 as "IEEE Std. 1149. 1".

Figure 2:
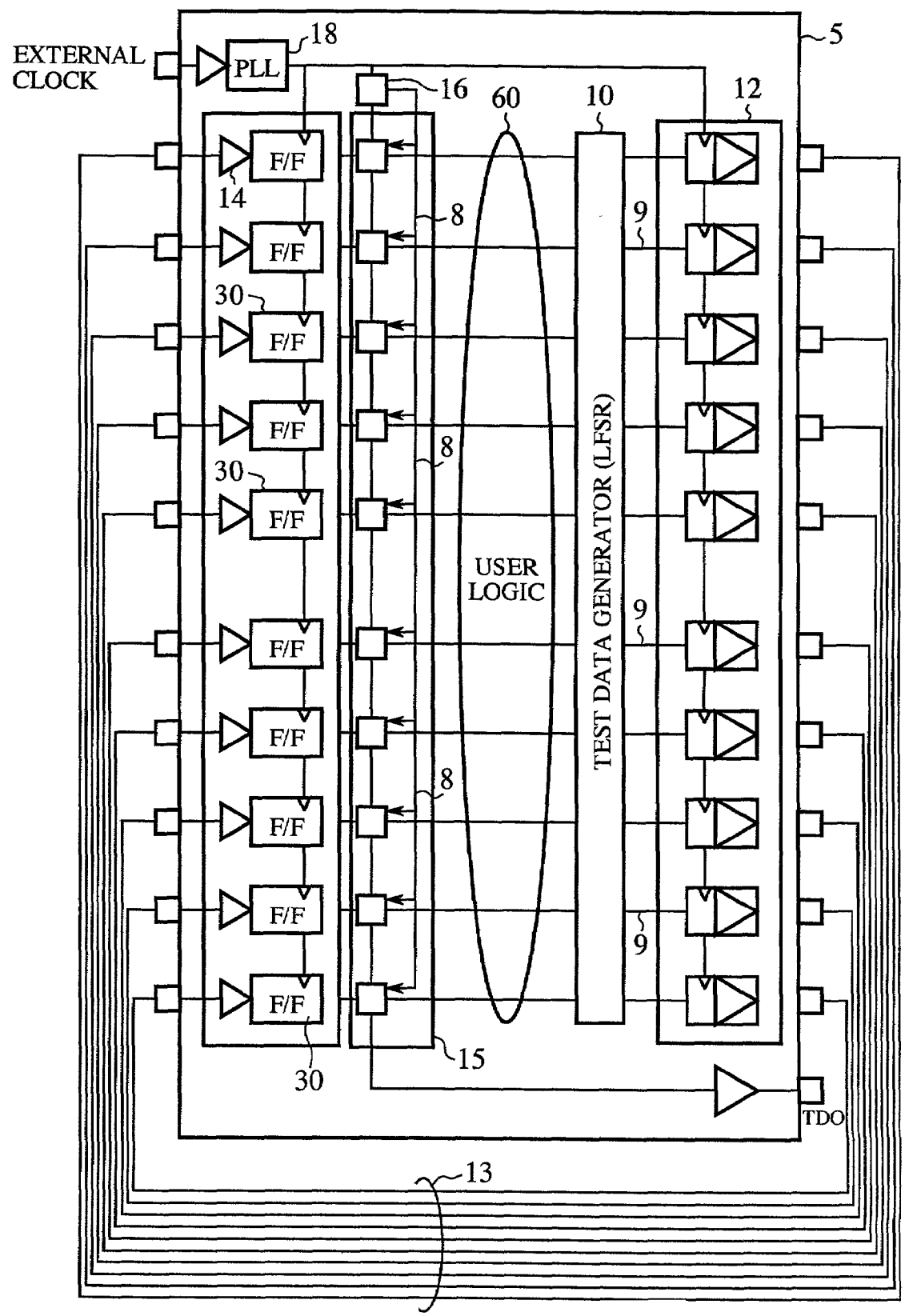
FIG. 2 is a diagram showing the circuit connection of the test system for a semiconductor device according to the first embodiment of the present invention.

FIG. 2 shows the data flow (connection) for each pin of the test system for a semiconductor device shown by the block diagram of FIG. 1. In the figure, reference numeral 30 denotes a flip-flop (F/F) and 60 denotes user logic. Since the components in FIG. 2 which are the same as or correspond to those in FIG. 1 are denoted by like numerals, their explanation will be omitted to avoid duplication.

The description will be given of the operation of FIG. 2. First, the test data 9 of pseudorandom data generated from the LFSR included in the test data generator 10 is output from the output buffer 12, and transferred to the input buffer 14 through the external wiring 13. The test data 9 transferred outside the chip is taken into each F/F 30 and compared with the expected-value data 8, which is the same as the pseudorandom data generated from the LFSR.

Figure 3:
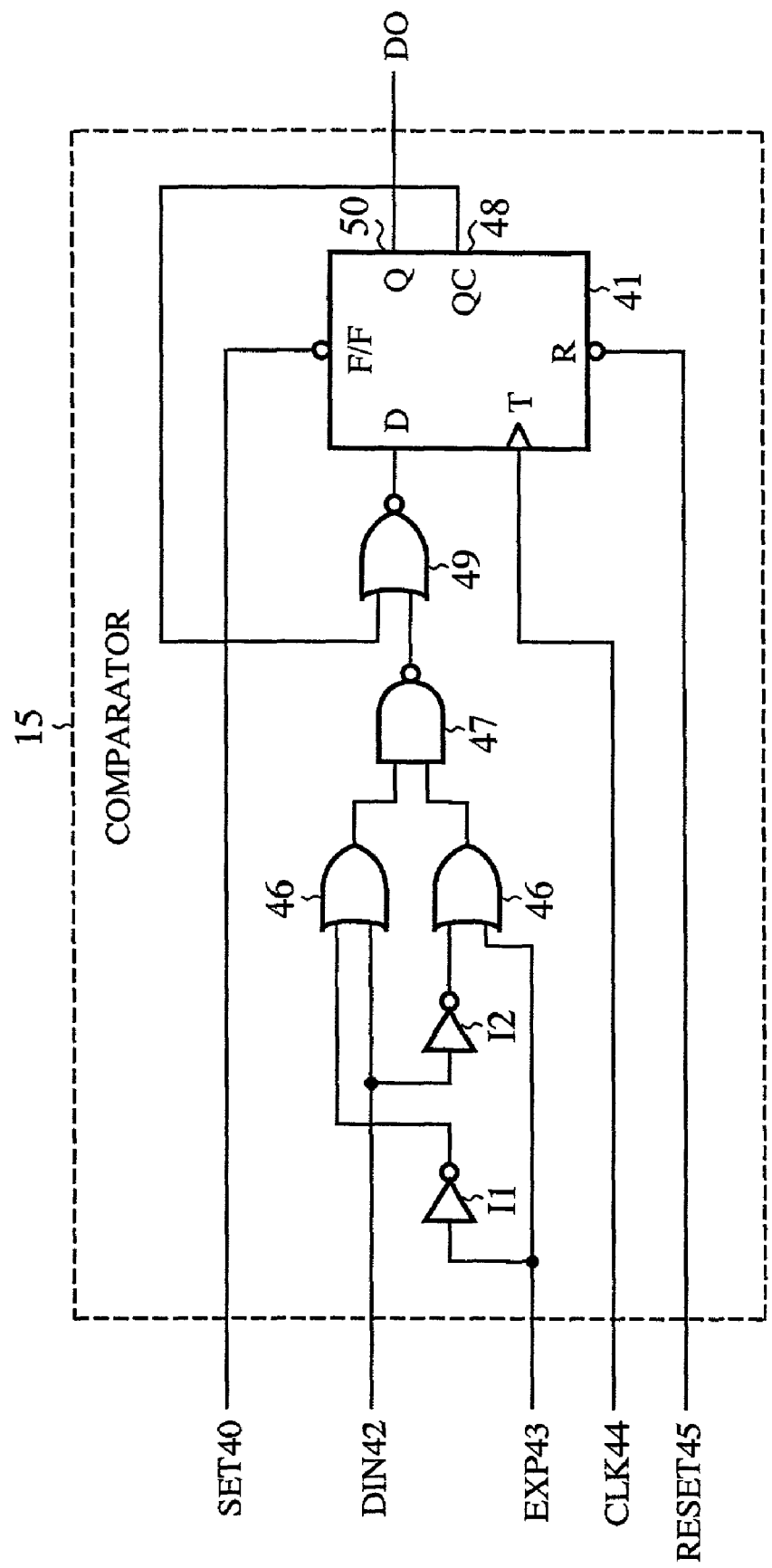
FIG. 3 is a circuit diagram showing a comparator according to the first embodiment of the present invention.

FIG. 3 is a circuit diagram showing the configuration of the comparator 15. In the figure, reference numerals I1 and I2 each denote an inverter; 40 denotes a SET pin; 42 denotes a DIN pin; 43 denotes an EXP pin; 44 denotes a CLK pin; 45 denotes a RESET pin; 41 denotes a flip-flop (F/F); 46 denotes an OR gate; 47 denotes a NAND gate; and 49 denotes a NOR gate. Reference numerals 48 and 50 indicate the output QC and the output Q of the F/F 41 respectively. Thus, the comparator 15 is made up of one F/F, two inverters, two OR gates, one NAND gate, and one NOR gate.

The description will be given of each terminal. The SET pin 40 receives a signal which sets the F/F 41 to "1"; the DIN pin 42 receives input data from the input buffer 14; the EXP pin 43 receives the expected-value data 8 generated from the LFSR included in the test data generator 10. Furthermore, the CLK pin 44 receives the clock 11 transmitted from the PLL 18 inside the LSI 5, and the RESET pin 45 receives a signal which sets the F/F 41 to "0".

Next, the description will be made of the operation of the comparator 15.

First, the signal applied to the SET pin 40 sets the F/F 41 to "1". The test data 9 which was transferred outside the chip and received by the input buffer 14 is applied to the DIN pin 42, and simultaneously the expected-value data 8 is applied to the EXP pin 43. If the test data 9 and the expected-value data 8 are the same, each of the two OR gates 46 outputs "1". Then, the output of the NAND gate 47 is set to "0". Since the output QC 48 of the F/F 41 is "0", the output of the NOR gate 49 is set to "1". That is, if both data are the same, the output Q 50 of the F/F 41 remains at "1".

If the data applied to the DIN pin 42 is different from that applied to the EXP pin 43, the output of one of the two OR gates 46 is set to "0", setting the output of the NAND gate 47 to "1". Then, since the output QC 48 is "0" and the output of the NAND gate 47 is "1", the output of the NOR gate 49 is set to "0". As a result, the data "1" set to the F/F 41 is replaced by "0". Then, the output QC 48 is set to the value "1" which is input to the NOR gate 49.

With one input of the NOR gate 49 set at "1", its output is always "0" and never changed to "1". Thus, once the test data 9 transferred outside the chip does not coincide with the expected-value data 8 transferred inside, the value of the output Q50 of the F/F 41 is changed from "1" to "0". Therefore, it is possible to utilize this change to perform a functional test on the I/O interface at the actual operation speed.

After a series of test data 9 has been output from the LFSR, the contents of the F/F 41 included in the comparator 15 is "scanned and shifted out". If the obtained data is "1", the test result is determined to have been passed (PASS). If it is "0", on the other hand, the device is defective.

Based on the configuration shown in FIG. 1, the description will be given of a 6-bit test circuit configuration (not shown) in which the output section, input section, expected-value storing section, and comparison section are each provided with 12 F/Fs for both edges of the clock 11 (that is, one F/F is assigned to each of the rising and falling edges of every piece of data, and two F/Fs are assigned to each bit).

First, the expected-value data 8 is latched into the expected-value register in the expected-value storing section through the delay circuit 16, and compared with the test data 9 transferred through the external wiring 13 by the comparator 15. Since a 6-bit LFSR is used, the data series of pseudorandom data is shifted entirely in a complete cycle after $2^6-1$ clocks (63 times) are supplied. It may be arranged such that setting of the number of the clocks to be supplied can be made arbitrarily and externally, eliminating the need for application of an extremely long clock cycle. For example, the number of clocks to be supplied (stop number) may be set in a counter in order to arbitrarily set the stop cycle by controlling the comparator 15.

With this test circuit, it is only necessary to connect the external LSI tester to such pins as 4 JTAG pins 19 (TCK pin 20, TMS pin 21, TDI pin 22, and TDO pin 51), the external clock 70 whose signal is applied to the PLL 18, the SET pin 40, and the RESET pin 45, and it is not necessary to use high-speed signals such as those for the I/O interface. Therefore, even in a test using a low-speed tester and a small number of pins, it is possible to test a high-speed multipin LSI at low cost without reducing the test quality.

Figure 4:
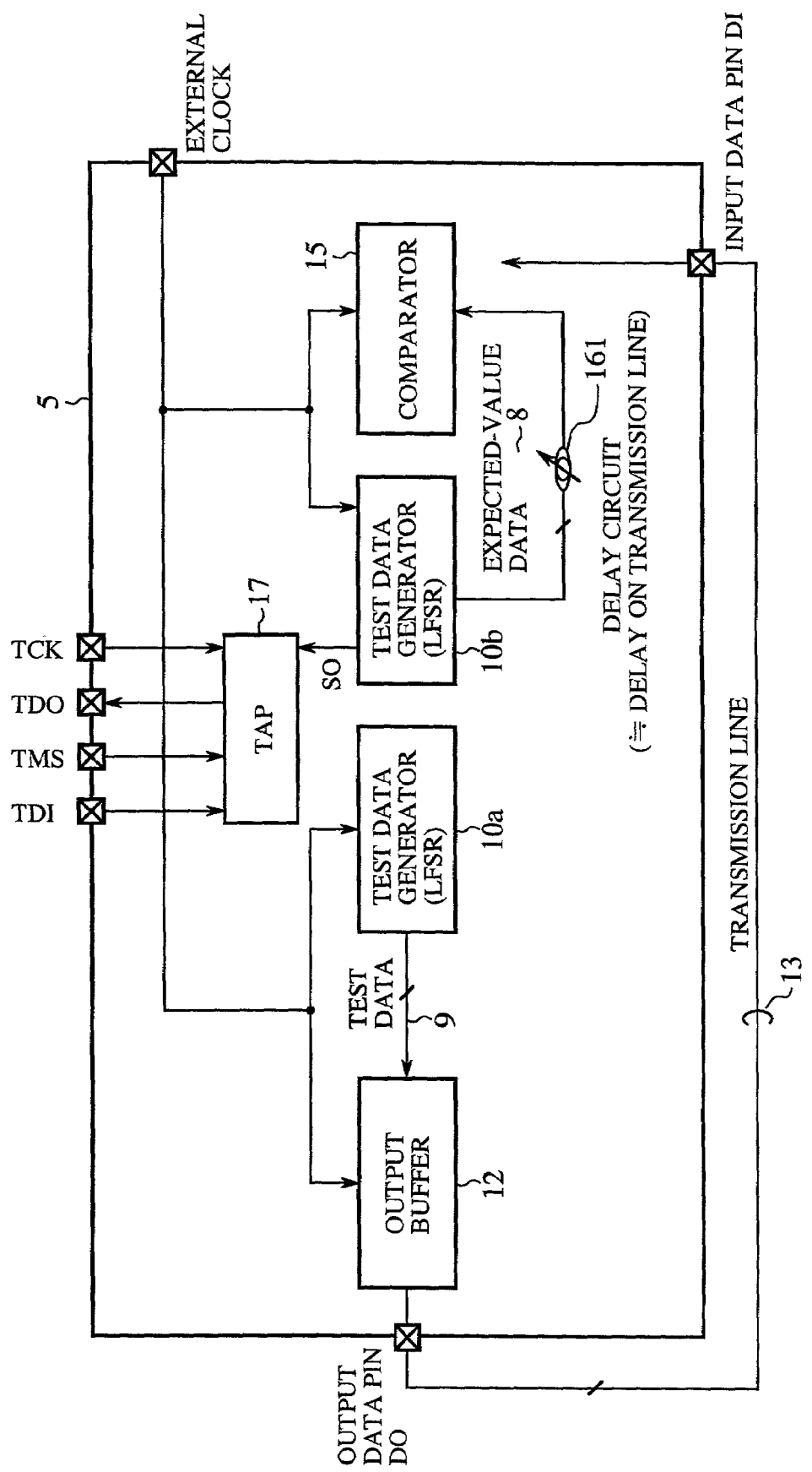
FIG. 4 is a block diagram showing a variation of the test system for a semiconductor device according to the first embodiment of the present invention.

On the other hand, in the above configuration, one LFSR included in the test data generator 10 generates both the pseudorandom data and the expected value, making it necessary to wire both the input section and the output section. This means that the wiring runs in a number of directions in the random logic section. As means for reducing the wiring running in a number of directions in the logic section, FIG. 4 shows a variation of the circuit configuration shown in FIG. 1. In FIG. 4, reference numerals 10a and 10b denote a first test data generator and a second test data generator (first data generating means and second data generating means), respectively, each made up of an LFSR, and 161 denotes a delay circuit (data adjusting means). It should be noted that the other components in FIG. 4 are the same as components shown in FIG. 1. The circuit configuration of FIG. 4 is different from that of FIG. 1 in that test data to be used as the expected-value data 8 is generated by the first test data generator 10b disposed in the input section. Thus, even though the test system in FIG. 4 employs an additional circuit constituting the first test data generator 10b, it is advantageous in that it is possible to reduce the wiring running in a number of directions in the logic section inside the LSI 5.

As described above, the first embodiment comprises: the test data generator 10 including the LFSR; delay circuits 16 and 161 for generating comparison data (expected-value data); and a comparator 15 having a sequential-comparison function; wherein the output pins of the output buffer 12 can be connected to the input pins of the input buffer 14 through external wiring. In this configuration, if the internal clock input to the test data generator 10 and the comparator 15 has the same speed as the actual system operation speed and the circuit elements are actually operated, the entire test system runs at the actual operation speed, making it possible to perform an actual operation test on the I/O interface of the LSI 5. This arrangement eliminates the need for employing a high-performance LSI tester with the effect of reducing the test cost.

Furthermore, the LFSRs 10a and 10b may be provided in the output section and the input section respectively to omit the wiring configuration in which wiring runs in a number of directions in the logic section included in the LSI 5.

It should be noted that even though the above first embodiment employs one or two test data generators, three or more test data generators may be provided. Further, as the data adjusting means, the above description illustrates the delay circuits 16 and 161 for adjusting the comparison timing. However, the present invention may use a data adjusting means for data adjustment other than delay adjustment, depending on the configuration.

Embodiment 2

The above first embodiment relates to a circuit for a functional operation test on the I/O interface at an actual operation speed. Another important test for the high-speed I/O interface is to verify the set-up and hold timing.

Figure 5:
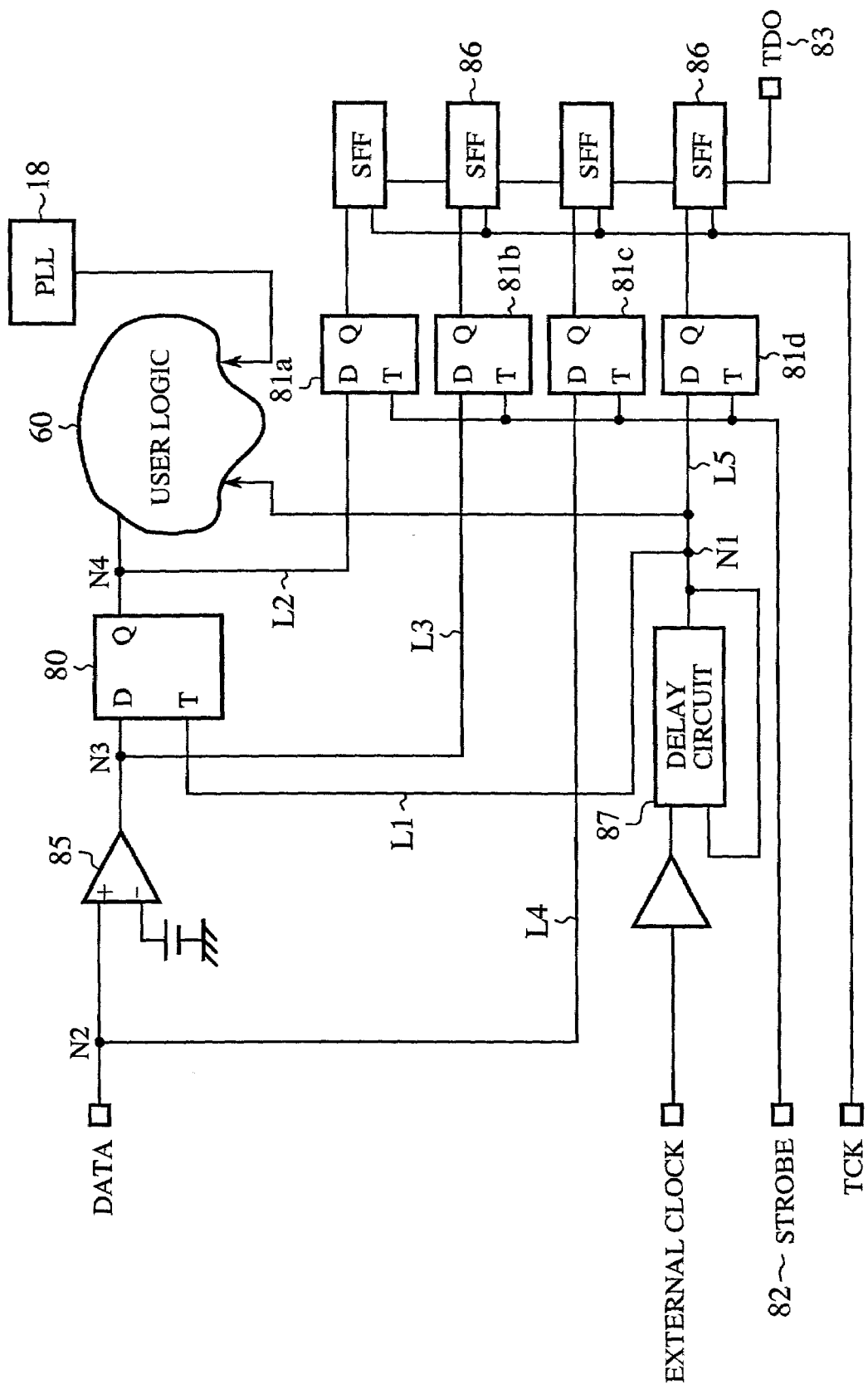
FIG. 5 is a block diagram showing a test system for a semiconductor device according to a second embodiment of the present invention.
Figure 6:
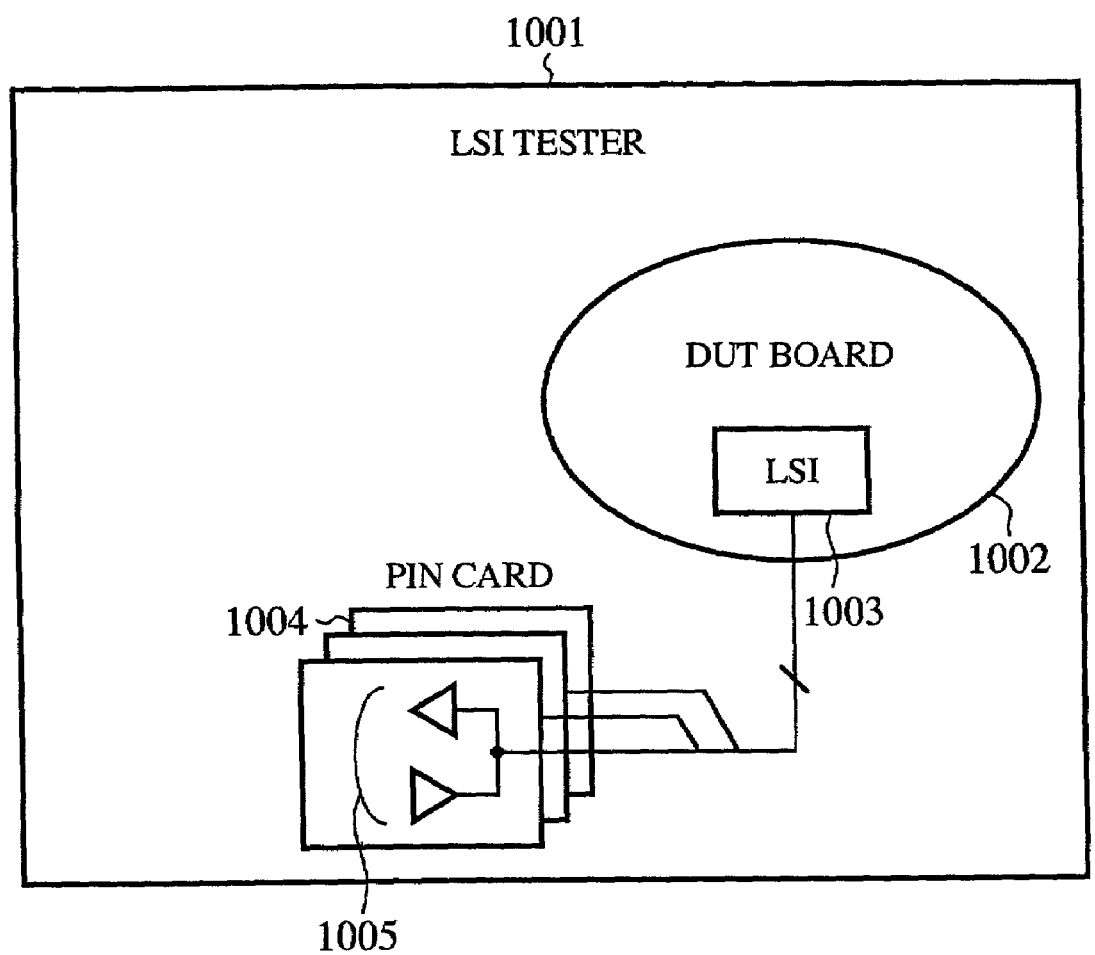
FIG. 6 is a block diagram showing a conventional test system for a semiconductor device.

FIG. 5 is a block diagram showing a semiconductor device according to a second embodiment of the present invention. In the figure, reference numeral 18 denotes a PLL; 80 denotes an internal flip-flop; 81a to 81d each denote a flip-flop for strobing operation (data latch means); 82 denotes a strobe pin; 83 denotes a TDO pin; 85 denotes a differential amplifier; 86 denotes a scan flip-flop; 87 denotes a delay circuit (data adjusting means); 60 denotes user logic; and N1 to N4 each denote a node. Incidentally, reference numeral 86 denotes a scan flip-flop (SFF) constituting a shift register for scanning, and 83 denotes a JTAG pin which outputs the contents of a selected register on, for example, a falling edge of a TCK signal.

In the configuration of FIG. 5, to verify whether the set-up and hold timing of the flip-flop 80 in the LSI 5 meets its specifications, the flip-flops 81a to 81d for strobing operation are connected to the input data (DATA) pin and the external clock pin. Furthermore, the components are arranged such that all of the following wiring lengths are equal: wiring length L1 from the node N1 Positioned after the delay circuit 87 to the input T of the internal flip-flop 80; wiring length L2 from the output Q of the internal flip-flop 80 to the input D of the flip-flop 81a for strobing operation through the node N4; wiring length L3 from the input D of the internal flip-flop 80 to the input D of the flip-flop 81b for strobing operation through the node N3; wiring length L4 from the DATA pin to the input D of the flip-flop 81d for strobing operation through the node N2; and wiring length L5 from the node N1 to the input D of the flip-flop 81d for strobing operation. In addition, the lengths from the strobe pin 82 to the inputs D of all of the flip-flops 81a to 81d for strobing operation are equal.

It should be noted that the term "strobe" generally refers to a value specifying a time position used when comparing output signals of an LSI (s) to determine whether or not it is defective. In an actual test, after a timing generator outputs a signal, the output signal level of the LSI is determined at the above specified value and the result is extracted.

Next, the operation of the semiconductor device of FIG. 5 will be described.

Data and a clock input through the DATA pin and the external clock pin, respectively, are captured by externally applying a strobe signal from the strobe pin 82. It should be noted that the strobe signal is set according to a specification at the time of the capturing, and if the data can be latched, the semiconductor device is determined to be nondefective. Otherwise, it is determined to be defective. In the above determination process, the latched data is scanned out from the TDO pin by use of the JTAG control and checked by an external inspection device.

At that time, the test data applied to the DATA pin can be generated by the test circuit of the first embodiment, or alternatively it may be generated by a high-speed tester. In the case of an I/O interface which can be operated at a low speed, a low-speed tester may be used since it can check the timing relations.

No skew occurs with the second embodiment since all of the wiring lengths L1 to L5 are equal and the distances from the strobe pin 82 to the flip-flops 81a to 81d for strobing operation are also all equal and, furthermore, the strobe function is commonly used. With this arrangement, it is possible to verify the timing of a high-speed I/O interface, eliminating the need for employing a tester having a high timing accuracy.

As described above, a semiconductor device according to the present invention comprises: test data generating means for generating test data; data adjusting means for, in order to use as expected-value data the test data after the data is transferred inside a chip, adjusting a time difference between the test data and the expected-value data; and comparison means for, against the expected-value data, comparing and verifying the test data after the test data is transferred outside the chip, the comparison means being provided in an input section.

Accordingly, it is possible to perform an actual operation test on the I/O interface of a semiconductor device by connecting the input section and the output section by use of external wiring, applying to the test data generating means and the comparison means an internal clock having the same speed as the system operation speed, and comparing and verifying, by use of the comparison means, the test data transferred through the external wiring and the internal expected-value data whose time difference with respect to the test data has been adjusted. This arrangement can eliminate the need for employing an expensive LSI tester and thereby reduce the test cost.

According to the present invention, the test data generating means is provided in an output section to output the test data and simultaneously transfer the test data through the data adjusting means to produce the expected-value data and transmit the produced expected-value data to the comparison means.

Similarly to the above effect, it is possible to perform an actual operation test on the I/O interface of a semiconductor device by connecting the input section and the output section by use of external wiring and applying to the test data generating means and the comparison means an internal clock having the same speed as the system operation speed. This arrangement can eliminate the need for employing an expensive LSI tester and thereby reduce the test cost.

According to the present invention, the test data generating means includes: a first test data generating means for generating test data to be transferred outside a chip, the first test generating means being provided in an output section; and a second test data generating means for generating test data to be transferred through the data adjusting means and set as expected-value data, the second test data generating means being provided in an input section.

Accordingly, it is possible to perform an actual operation test on the I/O interface of a semiconductor device by connecting external wiring similar to one described above and applying an internal clock having the same speed as the system operation speed. Furthermore, it is possible to reduce wiring which runs in a number of directions in an internal circuit such as a logic section of the semiconductor device.

According to the present invention, the test data generating means includes an LFSR which operates at an actual operation speed.

Accordingly, pseudorandom data is obtained at an actual operation speed as the test data.

According to the present invention, the comparison means includes a comparator which, at an actual operation speed, compares and verifies test data received from outside and expected-value data transferred through inside a chip.

Accordingly, it is possible to perform an actual operation test on the I/O interface of a semiconductor device.

According to the present invention, the data adjusting means includes a delay circuit which delays test data transferred through inside a chip to produce expected-value data.

Accordingly, it is possible to adjust a time difference of the expected-value data by delaying the timing of the test data.

A semiconductor device according to the present invention includes: test data generating means for generating test data; data adjusting means for, in order to use as expected-value data the test data after the test data is transferred inside a chip, adjusting a time difference between the test data and the expected-value data; comparison means for, against the expected-value data, comparing and verifying the test data after the test data is transferred outside the chip, the comparison means being provided in an input section; and external wiring for connecting an output of the test data generating means and an input of the comparison means.

Accordingly, it is possible to perform an actual operation test on the I/O interface of a semiconductor device by applying to the test data generating means and the comparison means an internal clock having the same speed as the system operation speed and comparing and verifying, by use of the comparison means, the test data transferred through the external wiring and the internal expected-value data whose time difference with respect to the test data has been adjusted. This arrangement can eliminate the need for employing an expensive LSI tester and thereby reduce the test cost.

According to the present invention, the test data generating means is provided in an output section to output the test data and simultaneously transfer the test data through the data adjusting means to produce the expected-value data and transmit the produced expected-value data to the comparison means.

Similarly to the above effect, it is possible to perform an actual operation test on the I/O interface of a semiconductor device by applying to the test data generating means and the comparison means an internal clock having the same speed as the system operation speed. This arrangement can eliminate the need for employing an expensive LSI tester and thereby reduce the test cost.

According to the present invention, the test data generating means includes: a first test data generating means for generating test data to be transferred outside a chip, the first test data generating means being provided in an output section; and a second test data generating means for generating test data to be transferred through the data adjusting means and set as expected-value data, the second test data generating means being provided in an input section.

Accordingly, it is possible to perform an actual operation test on the I/O interface of a semiconductor device by applying an internal clock having the same speed as the system operation speed. Furthermore, it is possible to reduce wiring which runs in a number of directions in an internal circuit such as a logic section of the semiconductor device.

According to the present invention, the semiconductor device is made up of a plurality of semiconductor devices, and an input pin and an output pin of each of the plurality of semiconductor devices are connected by use of external wiring.

Accordingly, it is possible to perform an actual operation test on the I/O interfaces of a large number of semiconductor devices at the same time with effect of reducing the test time.

According to the present invention, the test data generating means includes an LFSR which operates at an actual operation speed.

Accordingly, pseudorandom data is obtained at an actual operation speed as the test data, making it possible to perform an actual operation test.

According to the present invention, the comparison means includes a comparator which, at an actual operation speed, compares and verifies test data received from outside and expected-value data transferred through inside a chip.

Accordingly, it is possible to perform an actual operation test on the I/O interface of a semiconductor device.

According to the present invention, the data adjusting means includes a delay circuit which delays test data transferred through inside a chip to produce expected-value data.

Accordingly, it is possible to adjust a time difference of the expected-value data by delaying the timing of the test data.

A semiconductor device according to the present invention comprises: a circuit to be tested which receives external data from a data input pin; data latch means for, from a strobe pin, applying a strobe signal set according to a predetermined specification, and capturing output data from the circuit to be tested and a clock input from an external clock pin; and register means for extracting data latched in the data latch means; wherein a wiring segment from the data input pin to the data latch means, another wiring segment from the circuit to be tested to the data latch means, and still another wiring segment from the external clock pin to the circuit to be tested all have a same length.

Accordingly, it is possible to verify the timing of the circuit to be tested without causing a skew to occur by inputting strobe signals to the circuit elements constituting the data latch means at the same timing. This arrangement can eliminate the need for employing an LSI tester having a high timing accuracy and thereby reduce the test cost.

According to the present invention, the data latch means includes a plurality of flip-flops for strobing operation, and wiring segments from the strobe pin to the plurality of flip-flops for strobing operation all have a same length.

Accordingly, it is possible to test the timing of the circuit to be tested without causing a skew to occur by inputting strobe signals to the flip-flops for strobing operation at the same timing.

According to the present invention, the circuit to be tested is made up of an internal flip-flop; and a wiring segment from an output of the circuit to be tested to an input of a respective one of the plurality of flip-flops for strobing operation, another wiring segment from a data input of the internal flip-flop to a data input of a respective one of the plurality of flip-flops for strobing operation, and still another wiring segment from the external clock pin to the internal flip-flop all have a same length.

Accordingly, it is possible to verify the set-up and hold timing of the internal flip-flop.

According to the present invention, a shift register for scanning is connected to outputs of the plurality of flip-flops for strobing operation, and the outputs are lead out of a chip by use of JTAG pins.

Accordingly, it is possible to determine whether or not the semiconductor device is defective by use of an external inspection device by scanning out data latched in the register using the JATG control.

What is claimed is:

1. A semiconductor device comprising:
    test data generating means for generating test data;
    data adjusting means for receiving said test data from said test generating means and for, in order to use as expected-value data said test data to be transferred inside a chip, adjusting a time difference between said test data and said expected-value data; and
    comparison means for comparing and verifying said test data to be transferred outside said chip to said expected-value data, said comparison means being provided in an input section.

2. The semiconductor device according to claim 1, wherein said test data generating means is provided in an output section to output said test data and simultaneously transfer said test data through said data adjusting means to produce said expected-value data and transmit said produced expected-value data to said comparison means.

3. The semiconductor device according to claim 1, wherein said test data generating means includes:
    a first test data generating means for generating test data to be transferred outside a chip, said first test generating means being provided in an output section; and
    a second test data generating means for generating test data to be transferred through said data adjusting means and set as expected-value data, said second test data generating means being provided in an input section.

4. The semiconductor device according to claim 1, wherein said test data generating means includes an LFSR which operates at an actual operation speed.

5. The semiconductor device according to claim 1, wherein said comparison means includes a comparator which, at an actual operation speed, compares and verifies test data received from the outside and expected-value data transferred through inside the chip.

6. The semiconductor device according to claim 1, wherein said data adjusting means includes a delay circuit which delays test data transferred through inside the chip to produce expected-value data.

7. A test system for a semiconductor device, said semiconductor device including:
    test data generating means for generating test data;
    data adjusting means for receiving said test data from said test data generating means and for, in order to use as expected-value data said test data to be transferred inside a chip, adjusting a time difference between said test data and said expected-value data; and
    comparison means for comparing and verifying said test data to be transferred outside said chip to said expected-value data, said comparison means being provided in an input section; and
    said test system further comprising:
    an external wiring for connecting an output of said test data generating means and an input of said comparison means.

8. The test system for the semiconductor device according to claim 7, wherein said test data generating means is provided in an output section to output said test data and simultaneously transfer said test data through said data adjusting means to produce said expected-value data and transmit said produced expected-value data to said comparison means.

9. The test system for the semiconductor device according to claim 7, wherein said test data generating means includes:
    a first test data generating means for generating said test data to be transferred outside said chip, said first test data generating means being provided in an output section; and
    a second test data generating means for generating said test data to be transferred through said data adjusting means and set as expected-value data, said second test data generating means being provided in the input section.

10. The test system for the semiconductor device according to claim 7, wherein said semiconductor device is made up of a plurality of semiconductor devices, and an input pin and an output pin of each of said plurality of semiconductor devices are connected by use of the external wiring.

11. The test system for the semiconductor device according to claim 7, wherein said test data generating means includes an LFSR which operates at an actual operation speed.

12. The test system for the semiconductor device according to claim 7, wherein said comparison means includes a comparator which, at an actual operation speed, compares and verifies test data received from the outside and expected-value data transferred through inside the chip.

13. The test system for the semiconductor device according to claim 7, wherein said data adjusting means includes a delay circuit which delays test data transferred through inside the chip to produce expected-value data.

14. A semiconductor device comprising:
    a circuit to be tested which receives external data from a data input pin;
    data latch means for, from a strobe pin, applying a strobe signal set according to a predetermined specification, and for receiving and capturing output data from said circuit to be tested and for receiving a clock input from an external clock pin; and
    register means for extracting data latched in said data latch means;
    wherein a wiring segment from said data input pin to said data latch means, another wiring segment from an output of said circuit to be tested to said data latch means, and still another wiring segment from said external clock pin to said circuit to be tested all have a same length.

15. The semiconductor device according to claim 14, wherein said data latch means includes a plurality of flip-flops for strobing operation, and wiring segments from said strobe pin to said plurality of flip-flops for strobing operation all have a same length.

16. The semiconductor device according to claim 15, wherein said circuit to be tested is made up of an internal flip-flop; and a wiring segment from an output of said circuit to be tested to an input of a respective one of said plurality of flip-flops for strobing operation, another wiring segment from a data input of said internal flip-flop to a data input of a respective one of said plurality of flip-flops for strobing operation, and still another wiring segment from said external clock pin to said internal flip-flop all have a same length.

17. The semiconductor device according to claim 15, wherein a shift register for scanning is connected to outputs of said plurality of flip-flops for strobing operation, and said outputs are lead out of a chip by use of JTAG pins.

* * * * *